United States Patent
Liu et al.

(10) Patent No.: US 7,635,814 B2
(45) Date of Patent: Dec. 22, 2009

(54) PRINTED CIRCUIT BOARD

(75) Inventors: Chien-Hung Liu, Taipei Hsien (TW);
Shou-Kuo Hsu, Taipei Hsien (TW);
Yu-Chang Pai, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 54 days.

(21) Appl. No.: 11/941,979

(22) Filed: Nov. 19, 2007

(65) Prior Publication Data
US 2009/0056983 A1 Mar. 5, 2009

(30) Foreign Application Priority Data
Aug. 31, 2007 (CN) ............ 2007 1 0201552

(51) Int. Cl.
*H05K 1/00* (2006.01)
(52) U.S. Cl. .......... 174/250; 174/261; 174/255; 174/113 R; 174/36; 439/676; 439/540.1; 439/101; 439/941; 439/76.1
(58) Field of Classification Search ........ 174/260, 174/261, 250, 255, 36, 113 R; 439/676, 439/540.1, 101, 941, 76.1; 333/33, 4, 5; 257/786, 206; 361/761, 728, 748, 777, 780, 361/794, 803, 816, 818
See application file for complete search history.

(56) References Cited

U.S. PATENT DOCUMENTS

| | | | | |
|---|---|---|---|---|
| 5,357,050 A | * | 10/1994 | Baran et al. | 174/33 |
| 5,966,056 A | * | 10/1999 | Thornton | 333/5 |
| 6,089,923 A | | 7/2000 | Phommachanh | |
| 7,250,834 B2 | * | 7/2007 | Saitou et al. | 333/204 |
| 7,442,054 B2 | * | 10/2008 | Lemke et al. | 439/79 |
| 2002/0066589 A1 | * | 6/2002 | Lin | 174/113 R |
| 2004/0097112 A1 | * | 5/2004 | Minich et al. | 439/101 |
| 2005/0099240 A1 | | 5/2005 | Lin et al. | |
| 2006/0121793 A1 | * | 6/2006 | Pharney | 439/676 |
| 2006/0267048 A1 | * | 11/2006 | Chen et al. | 257/208 |
| 2007/0023930 A1 | * | 2/2007 | Miller et al. | 257/786 |
| 2008/0233806 A1 | * | 9/2008 | Rothermel et al. | 439/676 |

* cited by examiner

*Primary Examiner*—Dean A. Reichard
*Assistant Examiner*—Hoa C Nguyen
(74) *Attorney, Agent, or Firm*—Frank R. Niranjan

(57) ABSTRACT

A printed circuit board (PCB) includes first and second signal layers sandwiching a dielectric layer therebetween and a first differential pair and a second differential pair each having a positive differential trace and a negative differential trace. The positive differential traces of the two differential pairs are disposed within the first signal layer. The negative differential traces of the two differential pairs are disposed within the second signal layer. The positive differential trace of the first differential pair is defined at the left side of the positive differential trace of the second differential pair. The negative differential trace of the first differential pair is defined at the right side of the negative differential trace of the second differential pair.

2 Claims, 2 Drawing Sheets

PRINTED CIRCUIT BOARD

BACKGROUND

1. Field of the Invention

The present invention relates to printed circuit boards (PCBs), and particularly to a PCB which can reduce crosstalk between signal traces in the PCB, and can save space of the PCB.

2. Description of Related Art

The advancement of electronic industry demands more and more electronic components to be integrated on a single PCB. Additionally, smaller PCBs are demanded for smaller electronic products. As a result, a PCB with a limited area requires disposing components thereon more densely. This narrows the spacing between signal traces.

Conventionally, a PCB adopts a right-angle routing scenario, a 45 degree routing scenario, a differential routing scenario, or a zigzag routing scenario. In high-speed design applications, one usually employs the differential routing scenario.

Referring to FIG. 1, a partial cross-sectional view of a conventional PCB is illustrated. As shown, the PCB includes a first signal layer 100, a second signal layer 200, a first dielectric layer 300, a second dielectric layer 400, a third dielectric layer 500, a first ground layer 600, and a second ground layer 700, wherein a plurality of differential pairs, such as a first differential pair 120 and a second differential pair 140, are respectively disposed within the first signal layer 100 and the second signal layer 200. The first signal layer 100 is formed between the first dielectric layer 300 and the second dielectric layer 400. The second signal layer 200 is formed between the second dielectric layer 400 and the third dielectric layer 500. The first dielectric layer 300 is formed between the first signal layer 100 and the first ground layer 600. The third dielectric layer 500 is formed between the second signal layer 200 and the second ground layer 700. The first differential pair 120 includes a positive differential trace TX+ and a negative differential trace TX−. The second differential pair 140 includes a positive differential trace RX+ and a negative differential trace RX−. The first ground layer 600 is configured to supply a circuit path for the first differential pair 120. The second ground layer 700 is configured to supply a circuit path for the second differential pair 140.

However, the conventional PCB, illustrated in FIG. 1, is disadvantageous in that each of the differential pairs is disposed in a single signal layer, which allows crosstalk between two differential pairs respectively disposed within two adjacent signal layers. Furthermore, each conventional ground area is formed as an independent layer, which occupies lots of space of the PCB.

What is desired, therefore, is to provide a PCB which overcomes the above problems.

SUMMARY

An embodiment of a printed circuit board (PCB) includes first and second signal layers sandwiching a dielectric layer therebetween and a first differential pair and a second differential pair each having a positive differential trace and a negative differential trace. The positive differential traces of the two differential pairs are disposed within the first signal layer. The negative differential traces of the two differential pairs are disposed within the second signal layer. The positive differential trace of the first differential pair is defined at the left side of the positive differential trace of the second differential pair. The negative differential trace of the first differential pair is defined at the right side of the negative differential trace of the second differential pair.

Other advantages and novel features of the present invention will become more apparent from the following detailed description of an embodiment when taken in conjunction with the accompanying drawings, in which:

DETAILED DESCRIPTION

Figure 1:
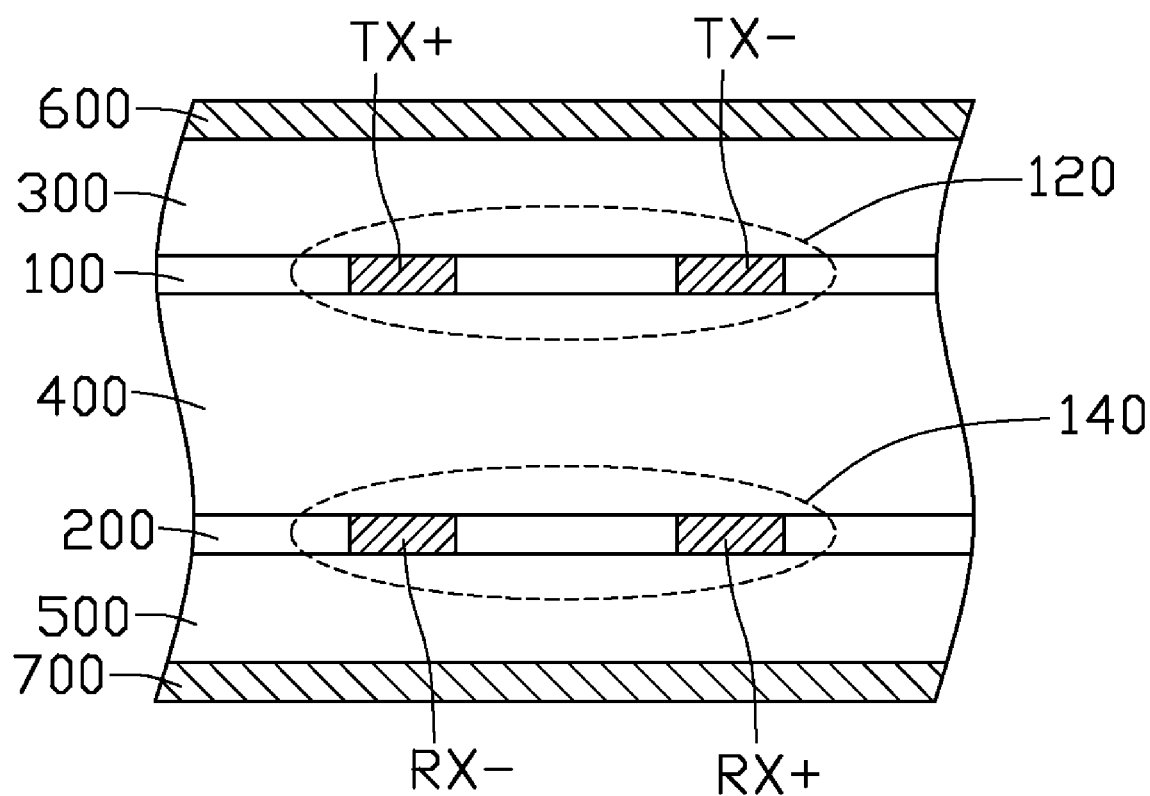
FIG. 1 is a partial cross-sectional view of a conventional PCB.
Figure 2:
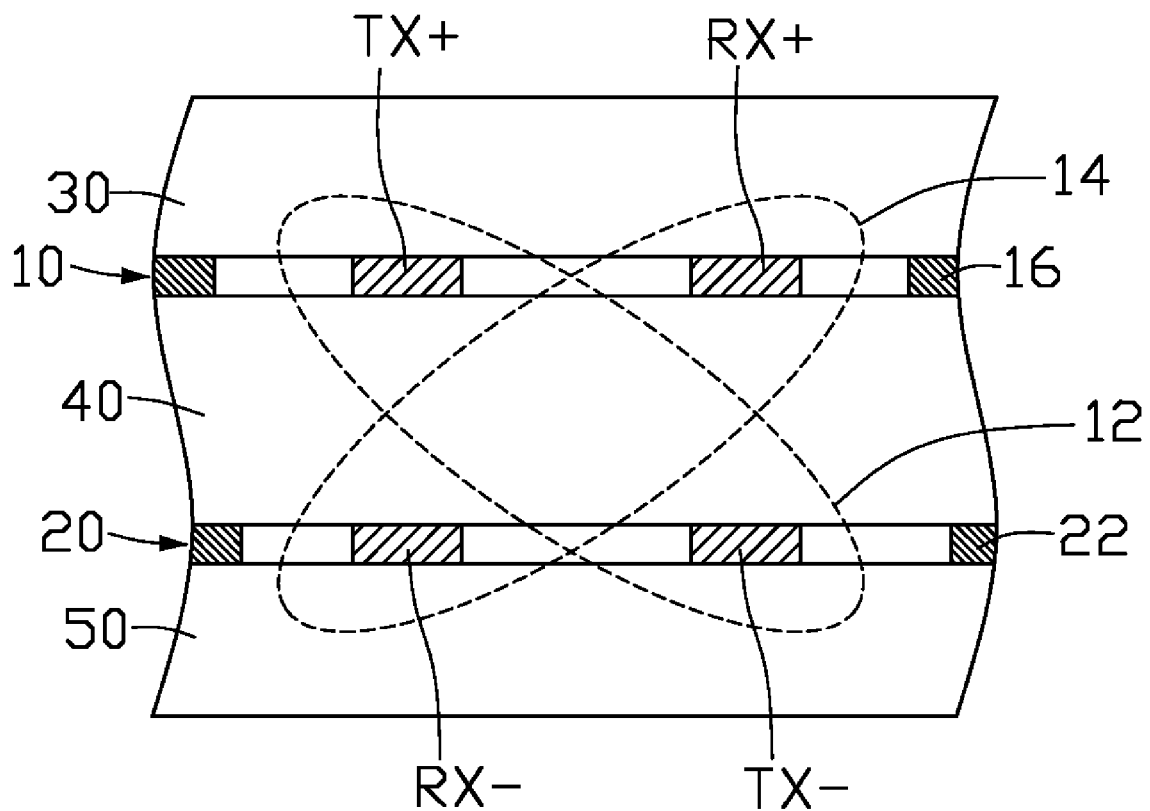
FIG. 2 is a partial cross-sectional view of a PCB in accordance with an embodiment of the present invention.

Referring to FIG. 2, a printed circuit board (PCB) in accordance with an embodiment of the present invention includes a first signal layer 10, a second layer 20, a first dielectric layer 30, a second dielectric layer 40, and a third dielectric layer 50. The first signal layer 10 is formed between the first dielectric layer 30 and the second dielectric layer 40. The second layer 20 is formed between the second dielectric layer 40 and the third dielectric layer 50.

A plurality of differential pairs, such as a first differential pair 12 and a second differential pair 14, are disposed within the first signal layer 10 and the second signal layer 20. The first differential pair 12 includes a positive differential trace TX+ and a negative differential trace TX−. The second differential pair 14 includes a positive differential trace RX+ and a negative differential trace RX−.

The positive differential trace TX+ of the first differential pair 12 and the positive differential trace RX+ of the second differential pair 14 are disposed within the first signal layer 10 and two first ground parts 16 respectively arranged at two sides of the first signal layer 10. The negative differential trace TX− of the first differential pair 12 and the negative differential trace RX− of the second differential pair 14 are disposed within the second signal layer 20 and two second ground parts 22 respectively arranged at two sides of the second signal layer 20. The first ground parts 16 are configured to supply a circuit path for the positive differential trace TX+ and the positive differential trace RX+. The second ground parts 22 are configured to supply a circuit path for the negative differential trace TX− and the negative differential trace RX−.

The positive differential trace TX+ is defined at the left side of the positive differential trace RX+, and the negative differential trace TX− is defined at the right side of the negative differential trace RX−, and the differential traces of the differential pairs 12, 14 are all equidistant from each other.

In another embodiment, the positive differential trace TX+ is arranged at a perpendicular bisecting line between the negative differential trace RX− and the negative differential trace TX−, and the negative differential trace TX− is arranged at a perpendicular bisecting line between positive differential trace TX+ and the positive differential trace RX+.

A crosstalk coefficient between the positive differential trace TX+ and the positive differential trace RX+ is K21. A crosstalk coefficient between the negative differential trace TX− and the positive differential trace RX+ is K24. A crosstalk coefficient between the positive differential trace TX+ and the negative differential trace RX− is K31. A crosstalk coefficient between the negative differential trace RX− and the negative differential trace TX− is K34. A crosstalk coefficient between first differential pair 12 and the second differential pair 14 is K which has a relationship between the crosstalk coefficients K21, K24, K31, and K34, that is K=(K21−K24)−(K31−K34). Because the distances between each two adjacent differential traces are the same, that is K21=K24 and K31=K34, thereby the crosstalk coefficient is equal to zero. So that crosstalk between the first differential pair 12 and the second differential pair 14 will be eliminated or nearly so.

Furthermore, the first ground parts 16 and the second ground parts 22 replace the conventional ground layers which saves space of the PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board (PCB) comprising:
    first and second signal layers sandwiching a dielectric layer therebetween; and
    a first differential pair and a second differential pair each having a positive differential trace and a negative differential trace, the positive differential traces of the two differential pairs disposed within the first signal layer, the negative differential traces of the two differential pairs disposed within the second signal layer;
    wherein the positive differential trace of the first differential pair is defined at the left side of the positive differential trace of the second differential pair, and the negative differential trace of the first differential pair is defined at the right side of the negative differential trace of the second differential pair; wherein two first ground parts are respectively arranged at two sides of the positive differential traces of the two differential pairs in the first signal layer to supply a circuit path for the positive differential traces of the two differential pairs, and two second ground parts are respectively arranged at two sides of the negative differential traces of the two differential pairs in the second signal layer to supply a circuit path for the negative differential traces of the two differential pairs.

2. The PCB as claimed in claim 1, wherein the differential traces of the first and second differential pairs are all equidistant from each other.

* * * * *